(12) United States Patent
McCarthy et al.

(10) Patent No.: US 6,346,296 B1
(45) Date of Patent: Feb. 12, 2002

(54) HIGHLY STABLE PACKAGING SUBSTRATES

(75) Inventors: Thomas McCarthy, Lake Hiawatha; Michael Wagaman, Morristown; David Schwind, Randolph, all of NJ (US)

(73) Assignee: AlliedSignal Inc., Morris Township, NJ (US)

( * ) Notice: Subject to any disclaimer, the term of this patent is extended or adjusted under 35 U.S.C. 154(b) by 0 days.

(21) Appl. No.: 09/396,106

(22) Filed: Sep. 14, 1999

(51) Int. Cl.⁷ .................................. B05D 3/02
(52) U.S. Cl. ................. 427/384.5; 427/387; 427/388.2; 526/285
(58) Field of Search ................. 526/285; 427/384.5, 427/387, 388.2

(56) References Cited

U.S. PATENT DOCUMENTS 5,145,926 A    9/1992  Patel et al. .................. 526/284

FOREIGN PATENT DOCUMENTS

EP          0 571 036 A1   11/1993
WO         WO 99/43638     9/1999

OTHER PUBLICATIONS

Schreiber, et al. "Polytriacetylenes: Conjugated Polymers With a Novel All–Carbon Backbone", dated Oct. 1994, pp. 786–790.

*Primary Examiner*—Edward J. Cain
(74) *Attorney, Agent, or Firm*—Curtis B. Brueske

(57) ABSTRACT

A method of producing a highly stable packaging substrate in which are provided a first precursor having a first backbone and a first ethynyl group, and a second precursor having a second backbone and a second ethynyl group. Furthermore provided is a crosslinker having a first and a second reactive group. The first precursor, the second precursor, the crosslinker, and a solvent are applied onto a surface to form an electrically insulating layer. The first ethynyl group is reacted with the first reactive group in a first carbon-carbon bond formation reaction and the second ethynyl group is reacted with the second reactive group in a second carbon-carbon bond formation reaction to crosslink the first backbone with the second backbone, thereby forming the packaging substrate. The solvent is removed in a further step.

29 Claims, 5 Drawing Sheets

Figure 5D    [₂HC=CHSi(CH₃)₂]₂O

Figure 5E    [₂HC=CHSi(CH₃)₂]₂NH₂

HIGHLY STABLE PACKAGING SUBSTRATES

FIELD OF THE INVENTION

The field of the invention is electronic packaging materials.

BACKGROUND OF THE INVENTION

Almost all electronic circuits require some form of packaging, which typically involves polymeric materials. In general, polymeric materials utilized in packaging applications must have a broad range of desirable physical properties. These properties include low coefficient of thermal expansion (CTE), thermal stability, high glass transition temperature, low moisture absorption, and adhesion to metal (Cu, Cr) and polymers. Further desirable properties include lasability, low dielectric constant, non flammability, resistance to solvents, acids, bases and other inorganics used in wet chemistry processing steps, as well as ease of processing, and low cost.

Many polymeric materials for packaging electronic circuits are known in the art, and can be categorized into various classes according to their chemical composition. For example, one class of polymeric materials comprises polyimides that are commonly found in fibers, coatings, and films. However, polyimides exhibit several drawbacks, including high moisture absorption, dimensional movement associated with moisture absorption, poor adhesion to some substrates, shrinkage at high temperatures, and a sidedness to films such that each side of the film may have very different properties.

In another class the polymeric materials comprise epoxy compounds. Polymeric materials made from epoxy compounds typically have a glass transition temperature of about 140°–220° C. and generally exhibit a moisture absorption of about 1–4%. While relatively inexpensive, most epoxy-based packaging compounds generally require drying and/or heat stabilization steps to allow their use in high density interconnect applications. For example, styrene-maleic anhydride/epoxies often exhibit desirable electrical and moisture properties. However, such epoxies having glass transition temperatures above 230° C. are generally difficult to manufacture, and frequently exhibit an undesirably high coefficient of thermal expansion.

In a further class the polymeric materials comprise polyarylenes. Polyarylenes are thermally stable polymers, but are often difficult to process due to relatively low solubility in common organic solvents. A number of different routes for the preparation of high molecular weight polyarylenes soluble in organic solvents have been proposed. In one route, as shown for example in U.S. Pat No. 5,227,457, Marrocco, III, M., et al. describe the introduction of solubilizing groups such as phenyls onto the polymeric chain. Unfortunately, the solubilizing groups may also render the resultant polymer sensitive to processing solvents. In another route, for example U.S. Pat. No. 5,334,668 to Tour, J., et al. crosslinkable polyphenylene compositions are prepared having a relatively low molecular weight initially, but form upon heating crosslinked polymers exhibiting increased solvent resistance. However, these compositions may have among other disadvantages insufficient gap filling properties.

In view of the problems of various prior art polymeric compounds for electronic packaging, phenylethynyl substituted aromatic polymeric materials have been developed. Phenylethynyl and acetylene substituted compounds are well known [*High Performance Thermosets,* ed. Shiow-Ching Lin & Eli M. Pearce, Hanser Publishers, New York, 1993, pg 221], and generally confer the advantage that they can be thermally induced to crosslink to form fused aromatic compounds. More advantageously, crosslinking of phenylethynyl and acetylene substituted aromatic polymeric materials can be performed in the complete absence of polar functionalities when carbon atoms in an aromatic compound are substituted with phenylethynyl groups. For example, in U.S. Pat. No. 4,730,032, Rossi et al. teach phenylethynyl functionalized aromatic compounds which crosslink in a temperature range of about 270–330° C. In another example, phenylethynyl substituted polymers with relatively high glass transition temperatures have been developed [*Polym. Prep.,* Am. Chem. Div., Polym. Div., 28(1), 67 (1987], and in a further example, WO 97/10193 to Dow Chemical Company, bis(o-diethynyl) monomers as shown in prior art FIG. 1 are described.

However, some problems still persist with phenylethynyl or acetylene substituted aromatic polymeric materials. First, a relatively high level of a palladium based catalyst is required which may lead to subsequent problems in purification. Second, in order to produce phenylethynyl substituted aromatic compounds such as bis(ortho-diphenylyethynyl) aromatic compounds, a multistep synthesis is typically required, disadvantageously increasing the cost of the synthesis. Third, because most of the phenylethynyl substituted aromatic compounds are designed for direct use on/with semiconductors (integrated circuit encapsulants), high thermal stability is required. However, high thermal stability often demands for non-halogenated products frequently resulting in arduous processes to insure the absence of halogens. Still further, crosslinked phenylethynyl substituted aromatic compounds tend to be brittle, and often require relatively high temperatures for complete curing.

In spite of various polymers hating been developed for packaging of electronic circuits, almost all such polymers suffer from one or more disadvantages. Therefore, there is a need to provide compositions and methods for improved packaging substrates for packaging of electronic circuits.

SUMMARY OF THE INVENTION

The present invention is directed to compositions and methods for improved packaging substrates for packaging of electronic components. In one step, first and second precursors are provided having a backbone, and first and second ethynyl groups. In another step a crosslinker is provided having a first and a second reactive group. In a further step the crosslinker, the precursors, and a solvent are applied to a surface. In a still further step first and second ethynyl groups from first and second precursors are reacted with the first and second reactive group of the crosslinker in a carbon-carbon bond formation reaction, respectively, thereby crosslinking the first backbone with the second backbone. In yet a further step, the solvent is removed.

In one aspect of the inventive subject matter, the first and second precursor preferably comprise a phenyl group, and more preferably a phenylindane. The ethynyl groups of the first and second precursors preferably comprise an aryl group, more preferably is an arylethynyl group and most preferably is a phenylethynyl group. It is also preferred that first and second precursors are identical, at least in an oligomeric form, or that first and second precursors are covalently bound together via a bridging group.

In another aspect of the inventive subject matter the precursor further comprises an adhesion enhancer covalently bound to the backbone of the precursor. Also preferred is that the precursor comprises a halogen atom, and more preferred a bromine atom.

In a further aspect of the inventive subject matter a toughener, preferably a butadiene-type compound or acrylonitrile/butadiene-type compound, is added to the solvent containing the first and second precursor and crosslinker.

Various objects, features, aspects and advantages of the present invention will become more apparent from the following detailed description of preferred embodiments of the invention, along with the accompanying drawings in which like numerals represent like components.

DETAILED DESCRIPTION

Figure 1:
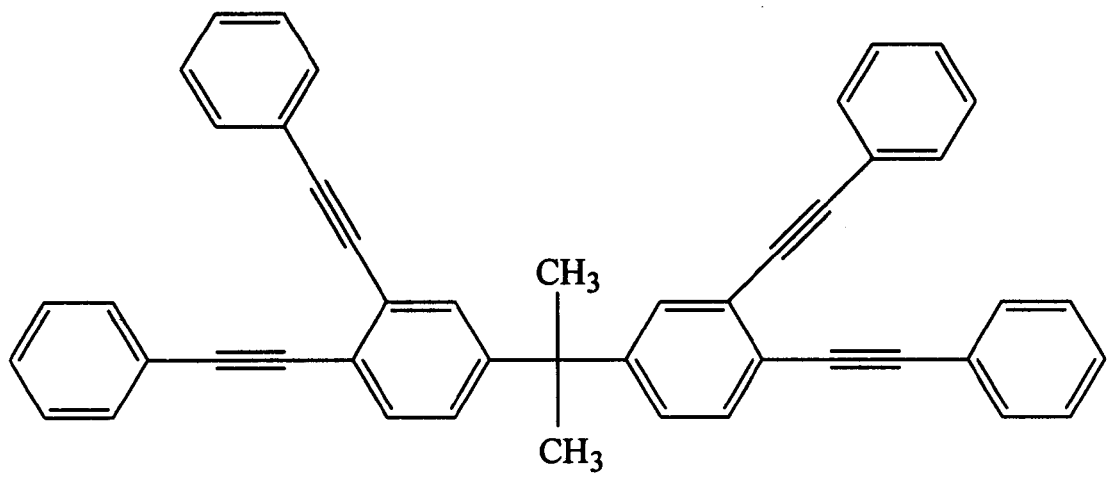
FIG. 1 is a prior art structure of a monomer for producing a packaging polymer.

As used herein, the term "backbone" refers to a portion in a molecule, onto which various substituents may be covalently bound. The backbone generally comprises more than 2 carbon atoms when the backbone is an aromatic compound. When the backbone is an inorganic compound, typically more than two atoms are found in the backbone. Moreover, the backbone may comprise repeating units. For example contemplated backbones include various organic polymer-type compounds including polyindanes, polyimides, polyesters and polyethers, polyether ketones, polyphosphazenes, polyether ether ketones, polysulfones, polyphenyleneoxides, but also monomer-type compounds including an indane, a phenyl group, and a vinyl group. Bonds or single atoms per se are not considered a backbone under the scope of the present definition.

As used herein, the term "packaging substrate" refers to a composite comprising an oligomeric or polymeric material which is impregnated into a reinforcement (e.g. glass) wherein the oligomeric or polymeric material may be cured, or partially cured. It is contemplated that the packaging substrate can be used for the high density interconnection of semiconductors and other components in the electronic industry. Although such composites are particularly applicable to electronics, they can also be used in any application where there is a need for non-flammable, low CTE composites such as in aerospace applications.

As used herein, the term "precursor" refers to a molecule which is chemically reactive and can be covalently coupled to another precursor or non-precursor molecule. Contemplated precursors may include organic, organometallic, and inorganic monomeric, oligomeric, and polymeric molecules.

As used herein, the term "crosslinker" refers to a molecule with at least two chemically reactive groups that are able to react with two precursors such that one precursor will be covalently bound to the first reactive group of the crosslinker, and another precursor will be covalently bound to the second reactive group of the crosslinker. Appropriate crosslinkers may also be molecules with a single reactive group that can undergo more than one chemical reaction. It is further contemplated that crosslinkers may have multiple reactive groups and that such crosslinkers may therefore covalently bind multiple precursors. A crosslinker, as contemplated herein, is capable of interconnecting a plurality of precursors such that the resulting crosslinked precursors will form a network having a molecular weight approaching the sum of the molecular weights of the precursors and crosslinkers that participate in the crosslinking reaction. It should further be appreciated that contemplated crosslinkers and precursors can react intermolecularly or intramolecularly.

As used herein, the term "adhesion enhancer" refers to a molecule, that when covalently bound to another molecule increases the adhesion of the other molecule to a substrate. Especially contemplated substrates are dielectrics including glass, polymeric fibers, paper based dielectrics, etc., but may also include other substrates including metals and organic compounds.

As used herein, the term "toughener" refers to a compound that, when incorporated (i.e. intimately mixed or covalently bound) into a substrate, imparts increased resilience towards mechanical challenges. For example, a toughener added to a compound may increase impact-, or scratch resistance, or may increase resistance to tear initiation and tear propagation.

Precursors

In one embodiment, the precursor has a backbone comprising a 1,1,3-trimethyl-3-phenylindane. Furthermore, the backbone comprises two aryl- and ethynyl groups, respectively, in the form of two phenylethynyl groups. The halogen atoms are two bromine atoms, which are covalently bound to the backbone. Also covalently bound to an aromatic portion of the backbone is a vinyl trimethoxysilane group as an adhesion enhancer (Structure 1).

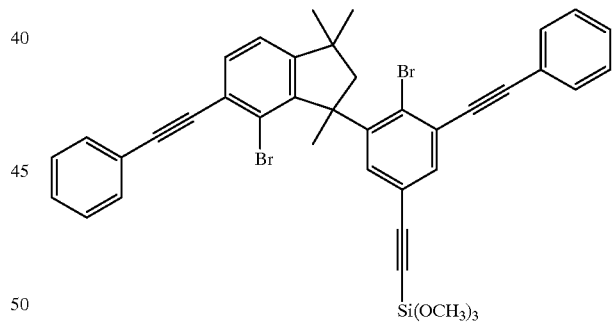

Structure 1

With respect to the backbone, many compounds other than a 1,1,3-trimethyl-3-phenylindane are contemplated, including organic, organometallic and inorganic compounds. Appropriate organic compounds may comprise a substituted or unsubstituted alkyl, a substituted or unsubstituted aryl, a substituted or unsubstituted alkenyl, or an substituted or unsubstituted alkynyl. For example, such alternative compounds include an ethyl, isopropylidine, fluoroisopropyl, ethenyl, 2-methyl-1,4-butadiene, propinyl, and 2-chlorobutinyl group. Further contemplated organic compounds may include saturated and unsaturated ring systems with at least one ring wherein the rings in a ring system may have any reasonable number of atoms, typically between 3 and 6. However larger ring systems are also contemplated, including fullerene-type structures and crown ether-type structures. It should further be appreciated that alternative organic compounds need not be restricted to carbon atoms as the sole constituents, but may also include common heteroatoms, such as N, O, S, P, etc. For example, appropriate compounds include a phenyl, benzil, benzoxazole, indane, 1,1,3-trimethyl-3-phenylindane, sulfone, benzobisimidazole, benzophenone, quinone, diphenylether, fluorinated anthracenyl groups, bismaleimides, phenyleneoxides, and so on.

Appropriate inorganic compounds may comprise substituted or unsubstituted metal oxides, including silicates, phosphates, alumina-type compounds, etc. For example, appropriate compounds include silica, alumina, and orthophosphate. Contemplated organometallic compounds preferably include Si, however, other metals are also contemplated, including Al, $PO_4$, etc. For example, alternative compounds may include SiC, poly(dimethylsiloxane) and poly(vinylsiloxane).

It should also be appreciated that any reasonable combination of organic, inorganic, and organometallic compounds may also be employed as alternative backbones, as well as oligomeric or polymeric forms of the aforementioned structures. Although many oligomeric and polymeric forms of backbones are contemplated, backbones comprising oligomeric 1,1,3-trimethylindanes are especially contemplated.

It is preferred that the backbone comprises at least two phenylethynyl groups, however, the backbone may also comprise one, or more than two phenylethynyl groups. For example, alternative backbones may include 3–5 or more phenylethynyl groups. It is also contemplated that the phenyl and the ethynyl group are coupled to each other via a conjugated system. For example, such conjugated system may include a phenylethenylethynyl, and a naphtalylethynyl. Still further contemplated are backbones wherein the ethynyl group and the aryl group are covalently bound to the backbone on different atoms of the backbone. For example, the ethynyl group may be bound to the phenyl portion of an indane, whereas the aryl group may be bound to the cyclopentenyl portion of the indane. In another example, the backbone may have only ethynyl groups and no phenyl group. Of course, when the ethynyl group and the aryl group are not covalently bound together, the number of individual aryl groups and ethynyl groups may vary considerably.

The halogen atoms bound to the backbone are preferably bromine atoms. Bromine is especially desirable because it confers non-flammability when covalently bound to an aromatic portion of the backbone. However, halogens other than bromine are also contemplated, including fluorine (which may reduce the dielectric constant), chlorine (which may confer increased oxidative stability and flame retardance), and iodine. It should also be appreciated that various numbers other than two halogen atoms may be bound to the backbone. For example, alternative backbones may include one, but also three and more halogen atoms. Of course, also contemplated is any reasonable combination among different halogen atoms.

Figure 2:
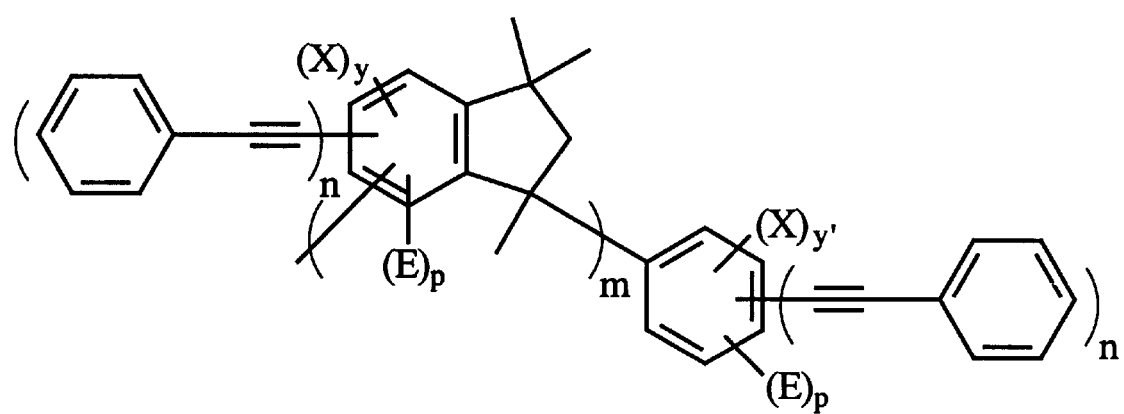
FIG. 2 is a structure of one precursor according to the inventive subject matter.

In a preferred embodiment, the adhesion enhancer is a vinyl trimethoxysilane. However, many alternative adhesion enhancers are also contemplated, including silanes and siloxanes. For example, appropriate adhesion enhancers include vinyltriethoxy silane, vinyltrimethoxy silane, vinylmethyldimethoxy silane, γ-methacryloxypropyltrimethoxy silane, vinyltriacetoxy silane, vinyl terminated siloxanes, and polysiloxanes. With respect to the attachment of the adhesion enhancer to the backbone it is preferred that the adhesion enhancer is covalently bound to an aromatic portion of the backbone, however the adhesion enhancer may also be located on a different, non-aromatic portion of the backbone. It is further contemplated that not all of the precursors need to have an adhesion enhancer, and the amount of adhesion enhancer may vary. A preferred amount of adhesion enhancer is between 0.1% and 5% (by weight) and a more preferred amount is between 0.3% to 3% (by weight). An exemplary structure of a precursor is shown in FIG. 2, wherein X is F, Cl, Br, or I, y=0–3, y'=0–3 and y+y'>0, m=1–10, n=0–3, p=0–3, and E is an adhesion enhancer.

In another embodiment, the precursor has a backbone comprising two 1,1,3-trimethyl-3-phenylindane moieties covalently bound together via an ethylene group as a bridging group. Both of the 1,1,3-trimethyl-3-phenylindane moieties are substituted with four aryl groups and four ethynyl groups configured in two phenylethynyl groups per 1,1,3-trimethyl-3-phenylindane moiety. The halogen atoms on the backbone are two bromine atoms, wherein one bromine atom is attached to one 1,1,3-trimethyl-3-phenylindane moiety, respectively. A vinyl trimethoxysilane group is covalently bound to an aromatic portion of one of the 1,1,3-trimethyl-3-phenylindane moieties as an adhesion enhancer (see Structure 2).

Structure 2

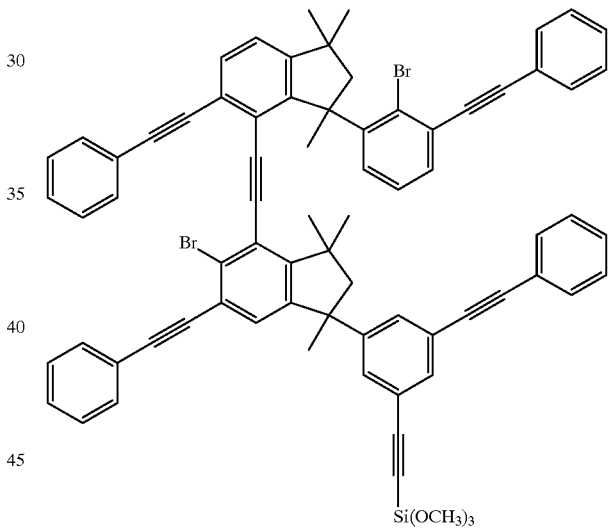

With respect to corresponding elements between the precursors of structures 1 and 2, the same considerations apply for precursor of structure 2 as discussed above. It should be appreciated that although the precursor of Structure 2 comprises two almost identical backbones, alternative structures with considerably different backbones are also contemplated.

It is preferred that the bridging group is an ethylene group, however, other bridging groups besides an ethylene group are also contemplated, including an ethynyl group and various divinyl compounds. Alternative bridging groups include diisopropenyl benzene, divinyl benzene, various divinyl acrylates such as ethylene diacrylate, divinyl alkyldiacetate, various divinyl ethers such as 1,4-butanediol divinylether, divinylsulfone, 1,3-divinyltetramethyldisiloxane, and 1,3,divinyl-1,1,3,3-tetramethyldisilazane. Other contemplated bridging groups are shown in FIGS. 5A–H, wherein the bridging groups are divinylsulfone, 1,4-butanedioldivinylether, ethylenediacrylate, 1,3-divinyltetramethyldisiloxane, 1,3-divinyl-1,1,3,3-tetramethyldisilazane, divinylbenzene, 1,3-diisopropenylbenzene, respectively. It should be appreciated that the use of bridging groups not only provides a cost-effective way of producing oligomeric precursors, but also can be used to tailor the viscosity and ultimate properties of the desired polymer. It is further contemplated that bridging precursors by employing bridging groups is preferably performed such that the molecular weight of the resulting bridged precursors is about or less than 10,000 Da, and more preferably between about 500 Da to 3000 Da. However, higher molecular weights are also contemplated.

It is generally preferred that the precursors according to the inventive subject matter have more than one phenylethynyl group covalently bound to the backbone. However, it should be appreciated that ortho-positioned phenylethynyl groups, although not excluded, are generally not preferred in the scope of the subject matter presented herein. More preferably, the phenylethynyl groups are randomly distributed on the aromatic portion of the backbone.

Figure 3:
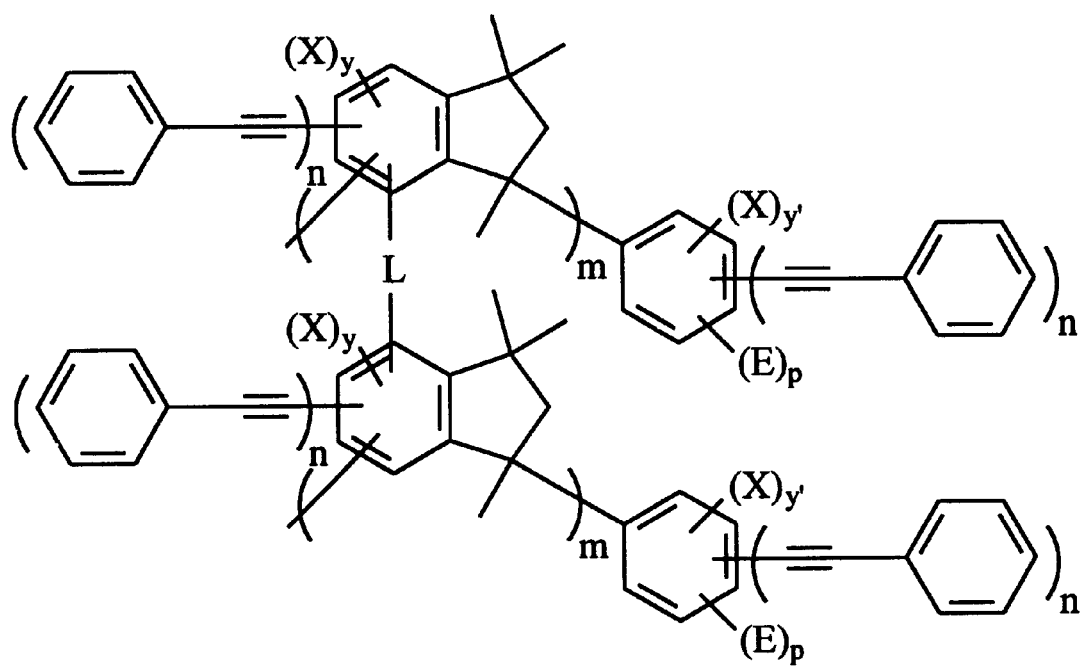
FIG. 3 is a structure of another precursor according to the inventive subject matter.
Figure 4:
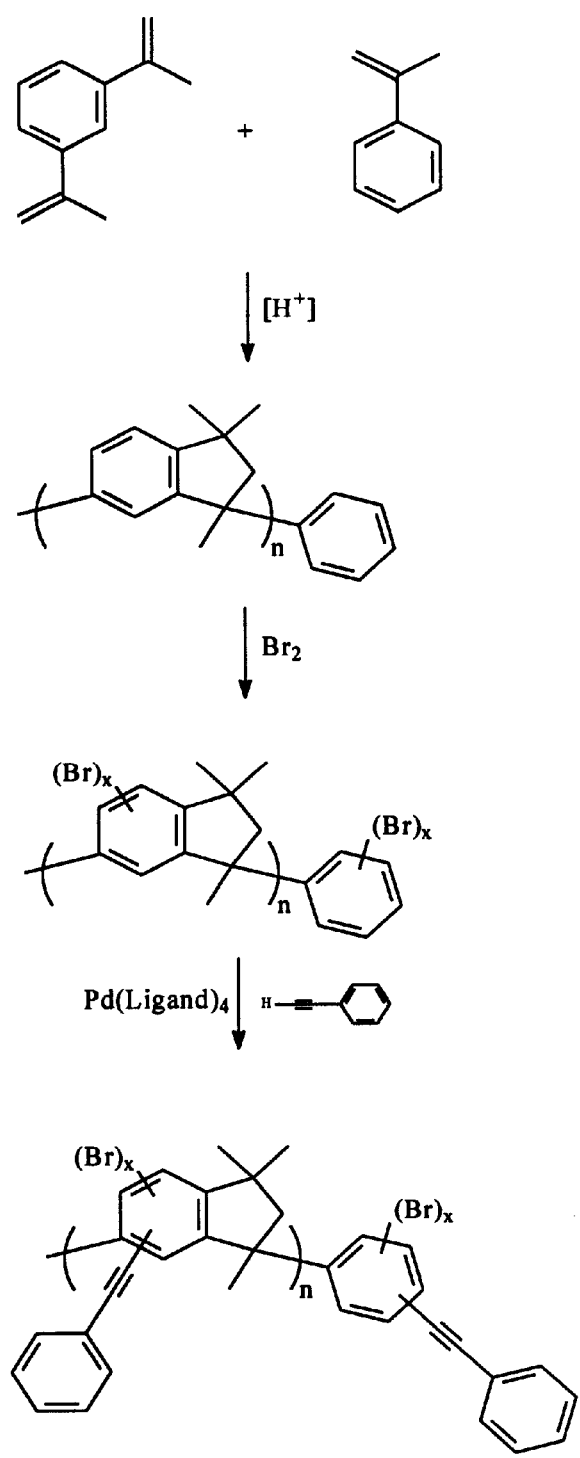
FIG. 4 is a synthetic scheme of a precursor according the inventive subject matter.
Figure 5A:
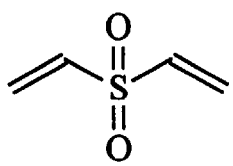
FIG. 5 shows various embodiments of bridging groups according to the inventive subject matter.
Figure 5B:
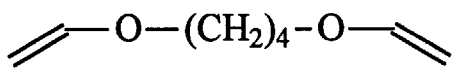
Figure 5C:
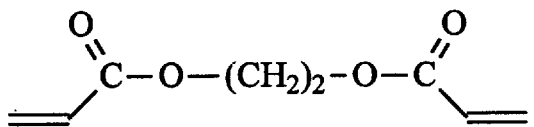
Figure 5F:
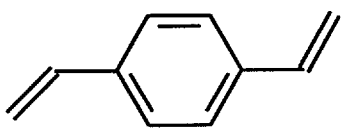
Figure 5G:
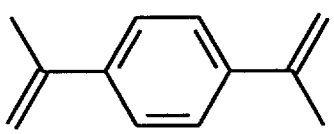

An exemplary structure of another precursor is shown in FIG. 3, wherein X is F, Cl, Br, or I, $y=0-3$, $y'=0-3$ and $y+y'>0$, $m=1-10$, $n=0-3$, $p=0-3$, E is an adhesion enhancer, and L is a bridging group. Further shown in FIG. 4 is an exemplary synthetic scheme of a brominated, phenylethynyl-substituted oligoindane precursor according to the inventive subject matter.

Methods of producing packaging substrates

In one preferred embodiment, a packaging substrate is prepared wherein in a first step first and second precursors are provided in equal quantities, totaling 3.5 g. Both the first and the second precursor are a brominated 1,1,3-trimethyl-3-phenylindane with four phenylethynyl groups covalently bound to the backbone wherein two of the phenylethynyl groups are bound in non-ortho position on the phenyl ring of the indane and another two phenylethynyl groups are bound in non-ortho position on the phenyl ring. In a next step, 5.8 g of a mixture of diphenylmethylenebismaleimide and diallylbisphenol A (commercially available as Kerimid 8292 (60% solids in n-methylpyrollidinone) NMP60 from Ciba Specialty Chemicals) is provided as a crosslinker. In a further step the crosslinker, first and second precursor are dissolved in methyletherketone and propyleneglycolmethyletheracetate as a solvent and dip coated onto the surface of two plies of 4.5"×5.5" 2116 woven glass. In a still further step, the carbon-carbon bond formation between the reactive groups of the crosslinker and the ethynyl groups is achieved in a Diels-Alder reaction by reacting the first and second diene group with the first and second ethynyl group by prepregging at 170° C. for five minutes and subsequent laminating of the plies in a Carver press (6×6", 5000 lb, heating at 240° C. for 4 hours), whereby the first and second backbones are crosslinked and the solvent is concurrently removed.

In alternative embodiments, the precursors need not be provided in the same quantities. It is contemplated that many ratios (by molarity or by weight) are appropriate, including ratios of 1%–99% of the first precursor to 1%–99% of the second precursor. It is also contemplated that first and second precursor need not be limited to the same precursor, but may also be different. Alternative precursors include a large variety of structures so long as such precursors comprise an aromatic portion and an ethynyl group. Appropriate precursors are discussed in the section precursors (Structure 1—vide supra). In further alternative embodiments the precursors comprise first and second precursor covalently bound together by a bridging group. Similarly, appropriate bridged precursors are discussed in the section precursors (Structure 2—vide supra).

In further alternative embodiments, the crosslinker need not be limited to a mixture of diphenylmethylenebismaleimide and diallylbisphenol A so long as alternative crosslinkers comprise a first and a second reactive group and are capable of formation of a carbon-carbon bond. Consequently, it should be appreciated that the mechanism of the carbon-carbon bond formation need not be limited to a Diels-Alder reaction, but may also include a 2+2 or a 4+2 cycloaddition, a free radical reaction, an ene-reaction, a Glaser coupling or a Straus coupling. It is generally preferred that alternative crosslinking moieties do not contain polar functionalities, which could possibly lead to increased absorbtion of moisture. It is further contemplated that alternative crosslinking moieties are hydrocarbon based, and that crosslinking occurs via a carbon-carbon bond formation reaction such that high glass transitions can be obtained. Thus, alternative crosslinkers may include benzocyclobutanes, various 3–4 atom strained rings including aziridines, diketenes, biscyanate esters, etc., bifunctional vinyl aromatic compounds, trifunctional vinyl aromatic compounds, and multifunctional vinyl aromatic compounds. For example, appropriate crosslinkers include benzocyclobutane, divinylbenzene, and trivinylbenzene.

Of course, it should be appreciated that the quantities of employed first and second precursor and crosslinker may vary considerably depending on the type of application. Small scale application may require milligram quantities, whereas larger scale applications may need gram to kilogram quantities.

Although the solvents in preferred embodiment are methyletherketone and propyleneglycol-methyletheracetate, many alternative solvents are contemplated. Generally, appropriate solvents are single solvents or solvent systems that are capable of at least partially dissolving first and second precursor and the crosslinker. However, other factors, including conditions of application, application quality and thickness, and end-use application influence the selection of an appropriate solvent. Representative solvents include hydrocarbons such as xylene, toluene, mesitylene, but also halogenated hydrocarbons such as dichloromethane or chlorobenzene. Further appropriate solvents may include esters, ketones, ethers, and so forth. It should also be appreciated that some applications may be performed without a solvent. Such applications may for example employ powdered or granulated first and second precursor and crosslinker.

In still further alternative embodiments, many impregnation techniques other than dip coating are contemplated, including various coating, printing, casting, or spraying techniques depending on the material, size and quality of the surface whereupon the first and second precursor and crosslinker are to be applied. Alternative application techniques include among many others knife coating, roll coating, screen printing, spin coating, solution casting, spraying etc.

In yet further alternative embodiments, the dielectric or reinforcing dielectric need not be restricted to 4.5"×5.5" 2116 woven glass. Alternative reinforcements include lightweight woven glass fabric, for example 101 glass with an individual fiber diameters range from 5–6.0 microns. Further alternative reinforcements include unidirectional crossplies, crossplies of unidirectional tape, film, fiber, or paper, and nonwoven papers. Nonwoven papers are desirable because of their uniformity, giving them superior lasing characteristics. Nonwoven paper can be prepared from staple fiber (otherwise known as floc), pulp, or a combination of staple and pulp. Staple fiber is generally referred to the longer fibers, whereas pulp is used to describe the shorter fibers. In general, longer staple has the advantage of better CTE control but leads to greater non-uniformity on the micron scale. Fiber pulp is generally obtained by chopping the fiber into very short fibers which are more uniform, have higher surface area, and typically absorb higher levels of moisture. Examples of nonwoven paper include those prepared from microfine glass, ceramic fibers, silica fibers, quartz, PTFE filaments, organic fibers such as liquid crystalline fibers, and natural fibers.

In other alternative dielectrics, organic fibers can be used. Poly(p-phenylene terephthalamide), known as Kevlar® and poly(1,3-phenylene isophthalamide), sold as Nomex® [Tokarsky, U.S. Pat. No. 4,729,921, Kirayoglu et al, U.S. Pat. No. 5,314,742] are used to produce an all-aramid nonwoven paper, sold by Du Pont. Polyaramids as a class of organic polymers are especially suited for these applications due to their inherent low CTE's. Copolyaramids prepared from meta and para-phenylenediamine, terephthalic acid, isophthalic acid, and 3,4-oxydiphenylenediamine, more specifically copoly(para-phenylene/3,4'-oxydiphenylene terephthalamide, Technora®) are particularly useful (Teijin Limited, U.S. Pat. No. 5,783,039). Liquid crystalline organic fibers which are useful as a reinforcement include Vectra® based on hydroxynapthoic acid and hydroxybenzoic acid. Another preferred organic fiber is PBO, or poly(p-phenylene-2,6-benzobisoxazole) available as Zylon® by Toyobo Co, Ltd., Shiga, Japan. It is preferred over polyimide due to its lower moisture absorbing properties. Where the dielectric is a film, Kapton ® (available from DuPont) and Upilex® (available from UBE Industries) are particularly preferred.

Although it is preferred that reacting the first and second ethynyl group with the first and second reactive group in a carbon-carbon bond formation reaction occurs preferably during the prepregging and laminating by applying thermal energy, various other reacting conditions are contemplated. For example, alternative energy sources may include UV-, VIS-, electromagnetic-, or particle radiation, exothermic chemical reactions, etc. It should also be appreciated that carbon-carbon bond formation reactions may occur between a crosslinker and two ethynyl groups of the same precursor, but more preferably between a crosslinker and a first ethynyl group of a first precursor and the same crosslinker and a second ethynyl group of a second precursor. Moreover, additional crosslinking may occur within a precursor or among more than one precursor in such cases where, for example phenylethynyl groups, are in ortho position to each other on an aromatic portion.

It should also be noted that by employing crosslinkers as coresins (e.g. benzocyclobutane), the thermal energy required to crosslink backbones is significantly reduced. For example, crosslinking in preferred embodiments generally occur at temperatures well below 250° C., whereas crosslinking of homopolymerized phenylethynyl functionalized aromatic compounds typically occurs at elevated temperatures of approximately 250° C.–375° C. [A. B. Morgan, J. M. Tour, *Macromolecules*, 1998, 31, 2857]. By the same token, it is contemplated that various energetically favorable reactions other than a carbon-carbon bond formation reaction may be employed for crosslinking, including nucleophilic addition to triple bonds by di- or multifunctional nucleophiles, redox reactions between a crosslinker and pendent groups of a precursor, entropically favored reactions (e.g. generation of $N_2$ driving the reaction) between crosslinker and pendent groups, and so forth.

With respect to removing the solvent, various techniques other than concomitantly removing solvent during prepregging/laminating are contemplated. Such alternative techniques include, but are not limited to baking the crosslinked backbones, vacuum drying, extraction with another solvent, etc.

Additives

It has been found that some tougheners can advantageously increase mechanical stability and flexibility of a packaging substrate according to the present inventive subject matter when added to the first and second precursor and crosslinker. Moreover, the addition of such tougheners typically does not compromise the glass transition temperature of the resulting packaging substrate. The resulting packaging substrate is more flexible, has a lower initial modulus relative to the equivalent non-toughener reinforced packaging substrates, yet has little or no thermal transitions between room temperature to 250° C. The modulus versus temperature remains substantially flat across this range, as well as the coefficient of thermal expansion. Preferred tougheners include butadiene- and butadiene/acrylonitrile based rubbers, however, other tougheners are also contemplated, many of which are well know to the art.

Depending on the desired end product, alternative packaging materials may further include dielectrics as described above, augmented with various inorganic fillers. Such fillers may include silica based nanospheres, hollow glass spheres, solid glass spheres, fused spherical silica, mica short chopped fibers, clay, talc, $TiO_2$, strontium titanate, which are used to enhance the dielectric constant and dielectric loss. Further contemplated fillers are ceramics, including boron nitride, silicon carbide, and beryllium oxide, which are known to enhance thermal conductivity.

In case of a woven or nonwoven glass-type dielectric, it is desirable that the fabric contain a binder, preferably a low moisture absorbing binder that facilitates polymer bonding to the reinforcing material. Binders or coupling agents are sometimes employed to improve bonding of filaments to other filaments within the reinforcement. It is also desirable that there is good interfacial adhesion between all components of the reinforcement and resin system, such that the material does not fail during reliability testing such as solder reflow (simulates the placement of a semiconductor onto an electronic package such as a flip chip ball grid array, or a rework process) or pressure cooker testing (simulates long term exposure of electronic package to moisture). Silane binders are typically added during the weaving process. The binder is applied to the fabric before resin impregnation, and should be present in sufficient quantity to completely coat all of the reinforcing materials fibers. Examples of useful silane based binders and coupling agents include CS718, CS767, and CS440, (manufactured by Clark-Schwebel, Inc), γ-aminopropyltriethoxysilane, γ-glycidoxypropyltrimethoxysilane, β-(3,4-Epoxycyclohexyl) ethyltrimethoxysilane, triethoxyvinylsildane, and hexamethyldisilazane. Binders may also include epoxy resins (e.g.multifunctional epoxies with aromatic diamines such as DDS), elastomer adhesives (Chemloc™), fluoroepoxies, "low Tg" resins such as acrylics, urethanes, aziridines, triazines, vinyl esters, rubbers, and so forth. It has been found that polyvinylmethylether is a particularly effective binder.

In the case of organic fiber-type dielectrics, it is often desirable to use much higher levels of binders, with levels reaching up to 20% (by vol.) or more. Preferred binders for organic fibers include polyaramides, such as Nomex®, precursors of polybenzoxazole with less than 100% ring closure, and polyamic acid precursors to polyimides. In some cases it might even be desirable to treat the surface of the dielectric/binder system before the first and second precursor and crosslinker are applied. Contemplated treatments might include plasma-, corona etching, ion bombardment, but also solvent etching, and mechanical etching including sandblasting. Further contemplated treatments include chemical etching (e.g. chromic acid, permanganate, $SO_3$, Na, $O_3$), electron beam exposure, and deposition of carbon/diamond like coatings.

Properties of packaging substrates according to the inventive subject matter

An exemplary flame retardant packaging substrate fabricated according to the herein presented method is shown in Structure 3 (reinforcing dielectric omitted). The first and second backbones are both a brominated phenylethynyl substituted trimethylindane, crosslinked with the crosslinker divinylbenzene. A first phenylethynyl group from the first backbone, and a first reactive aromatic vinyl group from the crosslinker divinylbenzene form a first carbon-carbon bond, and a second phenylethynyl group from the second backbone and a second reactive aromatic vinyl group from the same crosslinker form a second carbon-carbon bond.

not only have a Tg of about 275° C. to 375° C., but that they are also flame retardant due to their bromination. It should further be appreciated that the packaging substrate shown in Structure 3 need not be limited to having backbones comprising a brominated phenylethynyl substituted trimethylindane, or that such backbones are crosslinked with the crosslinker divinylbenzene. Alternative structures may include other backbones and other crosslinkers as described in the sections "precursor" and "method of producing packaging substrates". Also contemplated are structures having more than one crosslinker covalently binding one or more than one backbone together. It should further be appreciated that intermolecular crosslinking reactions may occur between crosslinkers only, or phenylethynyl groups only, and crosslinking reactions may also involve the bridging group.

The thickness of the resulting resin/binder/reinforcement laminate can be controlled by adjusting amount of the first and second precursor and crosslinker applied to the reinforcing dielectric. For example, in applications where microvias of about 2 mil depth are desired, the packaging substrate comprises between about 30–70% (by weight) first and second precursor and crosslinker. This can be controlled by varying the coating thickness and concentration of the first and second precursor and crosslinker in the solvent when the dielectric is coated onto a reinforcing substrate.

Lasing of the packaging substrate may be carried out by a frequency tripled Nd:yag, ultraviolet, $CO_2$, or excimer Structure 3

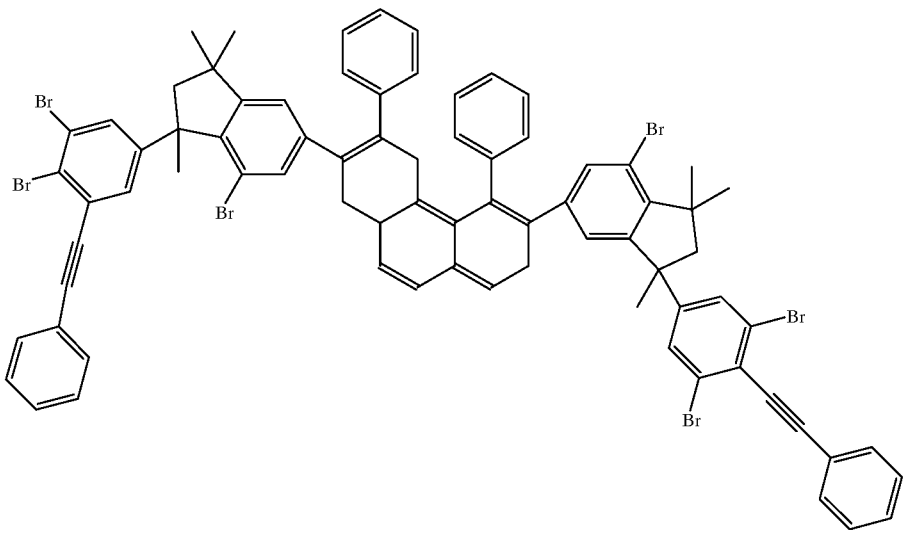

The crosslinked, phenylethynyl functionalized brominated aromatic is shown partially cured and is intended to demonstrate the type of reaction that may occur during the prepregging step. Because there are various other carbon-carbon bond forming reactions possible which may lead to various other molecules than shown in exemplary structure 3, structure 3 is shown by way of example, and is not intended to limiting to a particular structure. The packaging substrates produced according to the herein presented method are generally contemplated to have a Tg of about 250° C. to 400° C., and it is especially contemplated that when the packaging substrates are produced with brominated indanes (vide supra) that such packaging substrates laser. For larger holes (>3 mil) the $CO_2$ laser is preferred, while the Nd:YAG is well suited for 1–3 mil vias. Although lasing is a convenient way of manufacturing microvias, plasma generated holes and mechanically drilled or punched holes are also acceptable.

The electronic packaging substrates will have a CTE closely matched to that of copper (in the x and y directions). The packaging substrates typically have a x, y—CTE between that of silicon and copper, ranging from 2–17 ppm/° C., but may also have a CTE in the range between 2–25 ppm/° C., or higher. The moisture absorption is generally lower than 1% (by weight), 0.%5 being typical.

EXAMPLES

The following examples describe the synthesis of various precursors according to the inventive subject matter and the preparation of electronic package material thereof.

Example 1A

Preparation of Oligotrimethyl Phenyl Indane (DIPB:AMS=1:1)

To a 5 liter 3 necked round bottom flask equipped with an air driven mechanical stirrer was added 800 g of dry 1,2-dichloroethane and 20 g of trifluoroacetic acid. 209.0 g of 1,3-diisopropenylbenzene (1.32 mol) and 150.8 g of α-methylstyrene (AMS) (1.27 mol) were combined in an addition flask, and were added dropwise to the stirred solution over a 1 hr time period. After 1 hr of agitation in which the solution turned a light red color, 20 g of concentrated sulfuric acid was added dropwise. The vessel was cooled externally with ice water to maintain a temperature close to room temperature. The flask was allowed to stir overnight. 1 L of 10% basic NaOH in water was added to the flask, the 1,2-dichloroethane distilled away causing the precipitation of a solid, the product filtered and washed with deionized water, and then dried. $^1$H NMR analysis showed the presence of no internal olefins and the structure was consistent with the literature [Dittmer, T., Gruber, F., Nuyken, O., *Makromol. Chem.* 190, 1771–1790 (1989). Integration of the protons showed a ratio of 1.95:1.0 aliphatic protons to aromatic protons.

Example 1B

Bromination of 1A 75 g of 1A was refluxed in 250 g CCl$_4$ with stirring in a 1 L 3 neck flask equipped with a reflux condenser. 111.73 g of Br$_2$ was added slowly dropwise through an addition funnel located above the reflux condenser in such a way that bromine did not carry over through the nitrogen outlet located above the addition flask. A nitrogen inlet was fed into one of the necks of the 3 neck flask. Halfway through the bromine addition, 1 g of pyridine was added. After one day of reflux, the flask was cooled and residual bromine was neutralized by the addition of a 10% KOH aqueous solution. CCl$_4$ was removed by evaporation under reduced pressure. The solid was dried yielding 91 g of product. Bromine analysis indicated an insufficient level of bromination. The bromination was repeated at room temperature using 1.4 g of iron powder and 55 g of bromine. After the dropwise addition of bromine, the temperature was raised to 60° C. Isolation of the product and vacuum drying yielded 100.3 g of product having 42.80% bromine as determined by bromine analysis. $^1$H-NMR Integration of the protons showed a ratio of 2.17:1.0 aliphatic protons to aromatic protons.

Example 1C

Conversion of 1B to Phenylethynl Substituted Brominated Oligoindane 1C 50 g of 1B was dissolved in 180 g of anhydrous DMF and 210 ml of triethylamine in a 1 L 3 neck flask equipped with an addition funnel, a reflux condenser, and a rubber septa through which a cannula was inserted with a nitrogen purge. The vessel was heated to 90° C. and the contents were purged with nitrogen for one hour to remove oxygen. To the vessel was added 3.0 g of dichlorobis-(triphenyl-phosphine) palladium (II), followed by the dropwise addition of 20 g of phenylacetylene. The vessel was heated at reflux for 3 hours after which an additional 2 g of of dichlorobis(triphenylphosphine)palladium (II) was added and 5.0 g of phenylacetylene. The vessel was allowed to reflux 3 additional hours. The vessel was allowed to cool, after which 600 ml of methylene chloride was added. The organic solution was washed 3× with 0.5 L of a 10% HCl aqueous solution and separated each time, washed 2× with water, the organic phase separated and filtered, the black product reduced to dryness under low vacuum, dissolved in 300 ml THF, precipitated into water, filtered, vacuum dried, yielding 59.0 g of product. Bromine analysis yielded a 12.92% bromine content which is a marked reduction from the 42.8% of the starting material indicating a substitution of phenylethynl for bromine. $^1$H NMR Integration of the protons showed a ratio of 1.0:1.26 aliphatic protons to aromatic protons, which is consistent with the replacement of phenylethynl groups from bromine atoms. The proton spectrum was consistent with the oligoindane known in the literature, although the aliphatic protons were much broader and less resolved, and the aromatic region was rather complex. The following $^1$H NMR (CDCl$_3$)assignments can be made (ppm) for brominated phenylethynyl substituted poly 1,1,3-trimethyl-3-phenyl indane: phenylethynyl aromatic protons (7.53); aromatic protons derived from indane (7.26); 1,1,3-trimethyl, 6H (m, 1.06, 1.36); 1,1,3-trimethyl 3H (1.64),; 2H (2.0–2.4). Analysis by DSC (10° C./min) showed a weak exotherm from 70–125° C. likely corresponding to a softening point and a very broad endotherm ranging from 160–270° C. with a peak at 199.1° C. (103.4 J/g).

Example 1D

Preparation of a Packaging Substrate from 1C and Bismaleimide/diallylbisphenol A 3.5 g of 1C was dissolved in 3.49 g of methyletherketone, to which was added 5.833 g of Kerimid 8292 (60% solids in n-methylpyrollidinone) NMP60 from Ciba Specialty Chemicals (a mixture of diphenylmethylenebismaleimide and diallylbisphenol A). The solution was coated onto two plies of 4.5"×5.5" 2116 woven glass. The individual plies were prepregged at 170° C. for five minutes. The plies were stacked and laminated together in a Carver press (6×6", 5000 lb) and heated at 240° C. for 4 hours. Samples of laminate were cut into 1.3×5.0 cm strips and stacked together and measured in torsion using a Rheometrics, Inc., rheometer (RDS2:RSI Orchestrator), at 6.28 rad/sec, 0.5% strain, using an auto tension adjustment. A tan delta peak at 290° C. was observed. Onset of modulus loss (G') was 250° C. This example demonstrates that brominatedphenylethynyl substituted polyindanes can be co-cured with bismaleimide/diallyl compounds, acting as a crosslinking group to yield a laminate having a very high glass transition temperature.

Example 2A

Preparation of Polytrimethyl Indane (DIPB:AMS= 0.5:1)

Oligoindane oligomers were prepared as in Example 1A. 133.91 (0.846 mol) g of DIPB was reacted with 200 (118.18 mol) grams of AMS. $^1$H NMR analysis showed the presence of no internal olefins and the structure was consistent with the literature [Dittmer, T., Gruber, F., Nuyken, O., *Makromol. Chem.* 190, 1771–1790 (1989). Integration of the ratio of the aliphatic protons to the aromatic protons yielded a result of 1.45:1.0.

Example 2B

Bromination of 2A

Bromination of 2A was carried out in a similar fashion as described in 1B with some modification. 75 g of 2A was dissolved in 250 cc of carbon tetrachloride. At room temperature was added dropwise 58 g of $Br_2$. This solution was allowed to stir until evolution of HBr ceased. 1.4 g of iron powder was then added. This was allowed to stir until the evolution of HBr ceased. 58 g of additional bromine was added slowly. After the evolution of HBr slowed, the flask was slowly heated to reflux and allowed to reflux until the evolution of HBr ceased. The vessel was cooled, after which a 10% NaOH aqueous solution was added (1 L), followed by the addition of excess diethylether. The organic layer was washed 3x with basic water, washed with water, separated, the organic phase filtered, reduced to dryness under vacuum, and then vacuum dried. Bromine analysis yielded 37.67% Br. $^1$H NMR integration of the ratio of the aliphatic protons to the aromatic protons yielded a result of 2.16:1.0, correlating with the replacement of aromatic protons with bromine. The $^1$H NMR proton spectrum was consistent with published NMR spectra of polyindane, with signficant line broadening occurring.

Example 2C

Conversion of 2B to Phenylethynyl Substituted Brominated Oligoindane 2C

Conversion of 2B to 2C was carried out using the procedure of 1C. The wt % bromine content dropped from the 37.67 wt % of 2B to 7.25%. The proton spectrum was consistent with the polyindane known in the literature, although the aliphatic protons were much broader and less resolved, and the aromatic region was rather complex. The following $^1$H NMR ($CDCl_3$)assignments can be made (ppm) for brominated phenylethynyl substituted poly 1,1,3-trimethyl-3-phenyl indane: phenylethynyl aromatic protons (7.53); aromatic protons derived from indane (7.35); 1,1,3-trimethyl, 6H (m, 1.07, 1.38); 1,1,3-trimethyl 3H (1.62–1.72),; 2H (2.10–2.55). Integration of the ratio of the aliphatic protons to the aromatic protons yielded a result of 1.0:1.25. Analysis by DSC (10° C./min) showed an exotherm at 71° C. corresponding to a melting point and a very broad endotherm ranging from 145–280° C. with peaks at 193.2 (88.61 J/g) and 240° C. (32.3 J/g).

Example 2D

Preparation of a Packaging Substrate from 2C and Bismaleimide/diallylbisphenol A 6.66 g of 2C was dissolved in 5.96 g of methyletherketone, to which was added 5.5 g of Kerimid 8292 NMP60 (60% solids in NMP). The solution was coated onto two plies of 4.5"x5.5" 2116 woven glass. A laminate ws prepared using the procedure of 1D. A tan delta peak at 298° C. was observed. Onset of modulus loss (G') was 262° C. This example demonstrates that when the brominatedphenylethynyl substituted indane is the major component of the formulation and the bismaleimide/diallylbisphenol A is present as a crosslinking component, a very high glass transition temperature can be obtained.

Example 3A

Preparation of Oligotrimethyl Indane (DIPB:AMS= 1.5:1)

Oligoindane oligomers were prepared using the apparatus and procedure of Example 1A with the following modifications. After addition of TFA to carbon tetrachloride, the reaction flask was heated to reflux. 200.0 (1.26 mol) g of DIPB was combined with 99.27 (0.84 mol) grams of AMS and added dropwise over a period of 1 hour, after which the vessel was held at reflux a further four hours. A small sample was isolated and dried and showed a small degree of unsaturation remaining, the prescence of internal olefins being observed from 4.8–6.2 ppm. 20 g of sulfuric acid was then added dropwise and the vessel was allowed to reflux another day. $^1$H NMR analysis showed the minor presence of internal olefins (<5% of the protons could be assigned to vinylic protons (unsaturation), yet the structure was predominantly consistent with the literature [Dittmer, T., Gruber, F., Nuyken, O., *Makromol. Chem.* 190, 1771–1790 (1989). Integration of the ratio of the aliphatic protons to the aromatic protons yielded a result of 67.9:31.4.

Example 3B

Bromination of 3A

Bromination of 3A was conducted using the procedure of 1A. Bromine analysis showed 36.16% bromine. Integration of the ratio of the aliphatic protons to the aromatic protons yielded a result of 2.64:1, which is consistent with the replacement of aromatic protons with bromine. Otherwise the 1H NMR was consistent with the structure of polyindane as described in the literature.

Example 3C

Conversion of 3B to Phenylethynl Substituted Brominated Oligoindane 3C

Conversion of 3B to 3C was carried out using the procedure of 1C. The wt % bromine content dropped from the 36.16 wt % of 3B to 11.04%. The proton spectrum was consistent with the polyindane known in the literature, although the aliphatic protons were much broader and less resolved, and the aromatic region was rather complex. The following $^1$H NMR ($CDCl_3$)assignments can be made (ppm) for brominated phenylethynyl substituted poly 1,1,3-trimethyl-3-phenyl indane: phenylethynyl aromatic protons (7.52); aromatic protons derived from indane (7.38); 1,1,3-trimethyl, 6H (m, 1.06, 1.37); 1,1,3-trimethyl 3H (1.66),; 2H (1.8–2.45). Integration of the ratio the aliphatic protons to the aromatic protons yielded a ratio of 1.1:1.0. Analysis by DSC (10° C./min) showed a weak exotherm from 70–125° C. likely corresponding to a softening point and a very broad endotherm ranging from 130–300° C. with a peak at 193.0° C. (103.4 J/g).

Example 3D

Preparation of a Packaging Substrate from 3C and Bismaleimide/diallylbisphenol A 6.66 g of 2C was dissolved in 5.96 g of methyletherketone, to which was added 5.5 g of Kerimid 8292 NMP60 (60% solids in NMP). The solution was coated onto two plies of 4.5"x5.5" 2116 woven glass. A laminate was prepared using the procedure of 1D. A tan delta peak at 276° C. was observed. Onset of modulus loss (G') was 238° C.

Example 4A

Conversion of Brominated 1,1,3-trimethyl-3-phenylindane to Brominated Phenylethynyl Substituted 1,1,3-trimethyl-3-phenylindane To a 3 neck 500 ml flask equipped with a reflux condenser, additional flask, and septum, was added 25 g of brominated trimethyl phenyl indane (commercially available from the Dead Sea Bromine Company, FR-1808, 73 wt % Br), 0.469 g of (+)-neomenthyldiphenylphosphine, 67 g of anhydrous acetonitrile and 67 g of triethylamine. The vessel was brought to 70° C. and the solution purged with nitrogen through a cannula directly into the solution for one hour. 0.0399 g of palladium (II) chloride was added and the environment was purged from above the organic layer with nitrogen. The vessel was brought to reflux after which 25.63 g of phenylacetylene was added dropwise. The color changed from initially green to increasingly purple/black. Conversion of the brominated trimethylphenylindane, which was not very soluble in acetonitrile, to the brominated phenylethynyl substituted phenyl indane, which dissolved in acetonitrile, could be observed by the gradual dissolution of the starting material and the crystallization of triethylamine-hydrogenbromide as fine needles. After refluxing for 18 hours, the vessel was cooled and diluted in a separate flask with 600 ml of diethylether. 30.7 g of salt was filtered away. The organic phase was washed 3× with 10% HCl in water (700 ml), washed 2× with water, filtered, concentrated under reduced pressure, and vacuum dried yielding 32.0 g of product. Bromine analysis yielded 12.50% bromine which is a significant reduction from 73 wt % of the starting material. Palladium analysis indicated 0.053% (by weight) palladium in the product. The product was dissolved in MEK and passed through a commercial chelating ion exchange resin, Reillex 402 polymer, a vinylpyridine based resin (available from Reilly Industries, Inc.), and after concentration and drying the product had a palladium content of 0.041%. Differential scanning calorimetry (10° C./min) of the product showed an exotherm at 92.9° C. corresponding to sample melting, and a two endotherms at 246.2 and 292.3° C. corresponding to the inter/intramolecular crosslinking of the phenylethynyl groups. The following $^1$H NMR (CDCl$_3$) assignments can be made (ppm) for brominated phenylethynyl substituted poly 1,1,3-trimethyl-3-phenyl indane: phenylethynyl aromatic protons (7.63); aromatic protons derived from indane (7.39); 1,1,3-trimethyl, 9H (series of multiplets, complex spectrum 1.5–2.3); 2H (2.6–2.9). Integration of the ratio of the aliphatic protons to the aromatic protons yielded a result of 1.0:1.25. Analysis by DSC (10° C./min) showed a weak exotherm at 90° C. corresponding to a melting point and a very broad endotherm ranging from 160–340° C. with peaks at 246.8 (183.2 J/g) and 288.8° C. (143.1 J/g).

Example 4B

Preparation of a Packaging Substrates from 4A and Benzocylobutane

A solution was made containing to 16.8 g 4A, 12.81 g MEK, 8.88 g benzocylobutane (available from Dow Chemical as Cyclotene 3022-63 (BCB) which is a solution of 63% solids and 37% mesitylene), and 1.944 g Hycar 1300×33 butadiene/acrylonitrile rubber available from the B F Goodrich Co. The solution was divided into thirds. Each third was coated once onto two 4.5"×5.5" sheets of 2116 woven glass with a Meyer rod, allowed to dry, and then recoated. After drying, the sheets were prepreged at 230° C. for five minutes. After prepregging all laminates were prepared using a pressure of 5000 lbs and four hours, 4B(230) heated at 230° C., 4B(240) 240° C., 4B(250) 250° C., 4B(250 V) 250° C. under vacuum. The laminate was pressed using a Carver press between stainless steel sheets separated by a teflon sheet for release purposes. Samples of laminate were cut into 1.3×5.0 cm strips and stacked together and measured in torsion using a Rheometrics, Inc., rheometer (RDS2:RSI Orchestrator), at 6.28 rad/sec, 0.5% strain, using an auto tension adjustment. Moisture absorption was measured according to JEDEC level 1 standards. Samples were predried at 125° C. for one day to remove moisture. Samples were then weighed and placed in a humidity controlled oven (85% humidity, 85° C.) and weighed on a daily basis until the weight remained constant. Wt % moisture was calculated based on the laminate. Wt % moisture gain based on the resin was obtained by ashing the laminate, determining the resin content, and assuming that the glass did not absorb moisture. A separate moisture measurement (Method 2) was made using a Hidden IGAsorp which consists of a moisture and temperature controlled oven. A sample is placed and weighed in a chamber and dried at 85° C. with a dry nitrogen sweep until the weight comes to an equilibrium (the sample is dry), the humidity is then raised to 85% humidity and the sample is weighed until it comes to an equilibrium moisture gain. The sample is then dried using a similar procedure in order to calculate moisture absorption and desorption and the rate of absorption and desorption is recorded. Because all measurements are made in situ, there is little error. Method 2 showed very rapid absorption and desorption (<4 minutes) suggesting that the moisture being absorbed was not being absorbed by the resin or the glass but on the interface. A thicker 16 layer laminate 4B(250) showed equilibrium moisture absorption occurring in 9 minutes and desorption occurring in 4 minutes. A sample of pure resin prepared according to the conditions of 4B (250) had a moisture absorption of 0.5% by method 2.

| Sample | Onset of modulus loss/° C. (G') | Tan delta Maximum/ ° C. | Moisture absorption JEDEC (wt %) | Moisture absorption Method 2 (wt %) |
| --- | --- | --- | --- | --- |
| 4B(230) | 250 | 307 | 0.15 | 0.66 |
| 4B(240) | 270 | >310 | 0.21 | 0.73 |
| 4B(250) | 300 | >350 | 0.14 | 0.95 |
| 4B(250 V) | 290 | >350 | — | |

A similar solution was prepared on a larger scale to make a thick 1.6 mm laminate on 2116 glass using the conditions to prepare 4B(250). A bar was cut having the dimensions 1.6 mm×1.0 cm×5 cm and was measured using a Seiko DMA/TMA instrument in the three point bending mode (1 Hz, 3° C./min, under constant strain) where the sample was supported on it's ends and flexed in the middle perpendicular to the fiber directions which ran x,y. It therefore probes especially the z axis. The tan delta maxima was not observed by 350° C. The onset of modulus loss was 249° C. A 0.7 cm$^2$×1.6 mm sample was measured by TMA in the expansion mode at 10° C./min using a quartz probe (aluminum standard). The z axis expansion showed two inflection points, one at 224° C. and a larger one at 282° C. Z axis expansions were as follows (ppm/° C.): 20–150° C. (40.4), 100–178° C. (55.5), 245–260° C. (260), 283–286° C. (4,738). Total z axis expansion for the practical processing temperatures used in electronic packaging yielded 73.6 ppm/° C. for 23° C.–250° C. This example demonstrates that not only very high glass transitions can be obtained, but they can be obtained using an acrylonitrile/butadiene toughener which imparts flexibility to the laminate, yet does not compromise other key properties.

Example 4C

Conversion of Brominated 1,1,3-trimethyl-3-phenylindane to Brominated Phenylethynyl Substituted 1,1,3-trimethyl-3-phenylindane The experiment of 4A was repeated using 0.438 g of tris-o-tolylphosphine as a ligand instead of neomenthyldiphenylphosphine. The final product had 13.97 wt % bromine. This example demonstrates that the coupling reaction of phenylacetylene to the brominated aromatic can be accomplished with the less expensive, more readily available, tris-o-tolylphosphine.

Examples 5A–C

Preparation of a Packaging Substrate Using Brominated Phenylethynyl Substitutued 1,1,3-trimethyl-3-phenylindanes and BCB Electronic substrates were prepared from 1C, 2C, and 3C. A solution was made containing 5.6 g 1C, 4.27 g MEK, 2.96 g benzocylobutane (available from Dow Chemical as Cyclotene 3022-63 (BCB) which is a solution of 63% solids and 37% mesitylene), and 0.648 g Hycar 1300×33 butadiene/acrylonitrile rubber available from the B F Goodrich Co. Two sheets of 4.5×5.5" 2116 inch glass were coated, dried, and redried. Similar solutions were made using 2C and 3C. Laminates were prepared as in 4A and evaluated by DMA in the torsional mode as disclosed in 4A. Final press lamination was 4 hours at 250° C. These laminates were far stiffer than the examples in 4A, having an order of magnitude initial higher modulus (G'). Although the onset of modulus loss occurred at lower temperatures for these samples, they exhibited much higher moduli across the whole temperature range. The tan delta curve for 5B can be described as almost flat with a barely discernable maxima at 320° C.

| EXAMPLE | Resin | Onset of modulus (G') loss/° C. | Tan delta maximum/° C. |
|---|---|---|---|
| 5A | 1C | 210 | 277 |
| 5B | 2C | 258 | Very weak 320 |
| 5C | 3C | 230 | 294 |

Example 6A

Conversion of Brominated 1,1,3-trimethyl-3-phenylindane to Brominated Phenylethynl Substituted 1,1,3-trimethyl-3-phenylindane 6A was prepared using the procedure from 4A but with the following modifications. Bis(triphenylphosphine) palladium (II) dichloride was used as the catalyst. Final bromine content was 14.25%.

Example 6B

Preparation of a Packaging Substrate from Brominated Phenylethynyl Substituted Phenylindane and a PBO/glass Reinforcement A solution was prepared using 3.0 g Hycar 1300×33 butadiene/acrylonitrile rubber, 18.5 g Kerimid 8292 NMP60 (60% solids in NMP), 12.4 g MEK, 19.3 g propylenegly-colmethylether acetate, and 25.9 g 6A. The solution was coated with a Meyer rod onto a propietary nonwoven fabric (6"×6") consisting of microfiber glass, PBO pulp, and PBO staple. The laminate was prepregged for five minutes at 170° C. in an oven and pressed at 230° C. for 4 hours between two polytetrafluoroethylene sheets sandwiched between two stainless steel plates. Laminates were prepared having 49% resin content. They were analyzed using a four camera CTE method over a temperature range from RT to 230° C. The software is designed to provide a temperature cycle which measures the spacings between the holes at room temperature, 40° C., and every 20° C. interval up to 200° C. where the temperature spacing is reduced to 10° C. until 230° C. Before each measurement, other than the initial room temperature measurement, the instrument stabilizes the sample for 10 minutes at temperature before the separations between the holes are measured. The x,y CTE for this laminate remained flat at 10 ppm/° C. from RT to 100° C., after which it gently sloped up to 15 ppm/° C. which was the maximum x,y CTE reached, and then gently sloped downward back to 9.5 ppm/° C. by 230° C. This example demonstrates that very stable low x,y CTE's can be obtained using the combination of a brominated phenylethynyl substituted polyindane and a PBO/microfiber glass reinforcement.

Example 7A

Conversion of Brominated 1,1,3-trimethyl-3-phenyl Indane to Brominated, Phenylethnyl Substituted Divinyl Benzene Bridged, Oligomeric Phenyl Indane The experiment of Example 4A is repeated with the following modification: 0.3 g of 1,4-divinyl benzene is added to the 25.63 g of phenyl acetylene and the combined solution is added dropwise. The reaction is terminated after 11 hours by cooling and isolated according to Example 4A, with an expected yield of 31.0 grams of product. This example demonstrates that an oligomeric divinyl benzene bridged, phenylethynyl functionalized, brominated aromatic can be prepared in a one convenient step process.

Example 8A

Conversion of Brominated Trimethylphenyl Indane to Brominated, Phenylethynyl Substituted, Diisopropenyl Benzene Bridged, Oligomer Phenylindane The experiment of Example 7A is repeated with the following modification: 0.75 g of 1,3-diisopropenyl benzene is used instead of 1,4-divinyl benzene. This example demonstrates that an oligomeric, 1,3-diisopropenylbenzene bridged, phenylethynyl functionalized, brominated aromatic can be prepared using 2.5% by weight of a bridging unit.

Example 9A

Conversion of Brominated Trimethyl Phenyl Indane to Brominated Phenylethynyl Substituted, Silicon Containing Phenyl Indane The experiment of 4A is repeated with the following modification: 0.3 g of vinyl-tris(beta-methoxyethoxy) silane is added to the 25.63 g of phenylacetylene and the combined solution is added dropwise. The reaction is terminated after 10 hours by cooling and isolated according to Example 4A. This example demonstrates that a silicon containing functional group that is useful for adhesion to substrates, particularly glass, can be conveniently introduced into a brominated, phenylethynyl aromatic compound. A laminate is prepared using the same process of Example 4B showing no tendency to blister during a prolonged pressure cooker test or solder float test.

Example 10A

Conversion of Brominated Trimethyl Phenyl Indane to Brominated, Phenylethynyl Substituted, Silicon Containing Phenyl Indane The experiment of Example 9A was repeated with the following modification: 1.3 g of vinyltriethoxysilane is used instead of tris(beta-methoxyethoxy)silane. A laminate is prepared using the same process of Example 4B showing no tendency to blister during a prolonged pressure cooker test or a solder float test.

Example 11A

Conversion of Brominated Trimethyl Phenyl Indane to Brominated, Phenylethynl Substituted, Silicon Containing, Oligomeric Phenyl Indane The experiment of 4A is repeated with the following modification: 0.5 g of gammamethacryl-oxypropyltrimethoxy silane is added to the 25.63 g of phenylacetylene, in addition to 0.75 g of 1,4-divinylbenzene and the combined solution is added dropwise. The reaction is terminated after 10 hours by cooling and isolated according to Example 4A. This example demonstrates that a silicon containing functional group that is useful for adhesion to substrates, particularly glass, can be conveniently introduced into a brominated, phenylethynyl oligomeric aromatic compound. A laminate is prepared using the same process of Example 4B showing no tendency to blister during a prolonged pressure cooker test or a solder float test. This laminate is more flexible and showing a higher fracture toughness than comparable laminates produced from phenylethynyl, brominated aromatics having no bridging groups, or aromatics that are not oligomeric in nature.

Example 12A

Conversion of Brominated Trimethyl Phenyl Indane to Brominated, Phenylethynyl Substituted, Silicon Containing Oligomeric Phenyl Indane The experiment of 4A is repeated with the following modification: 1.2 g of vinyltrimethoxy-silane is added to the 25.63 g of phenylacetylene, in addition to 0.75 g of 1,3-diisopropenylbenzene, and the combined solution is added dropwise. The reaction is terminated after 10 hours by cooling and isolated according to Example 4A. This example demonstrates that a silicon containing functional group that is useful for adhesion to substrates, particularly glass, can be conveniently introduced into a brominated, phenylethynyl oligomeric aromatic compound. A laminate is prepared using the same process of Example 4B showing no tendency to blister during a prolonged pressure cooker test or a solder float test. This laminate is more flexible and shows a higher fracture toughness than comparable laminates produced from phenylethynyl, brominated aromatics having no bridging groups, or aromatics that are not oligomeric in nature.

Thus, specific embodiments and applications of improved packaging substrates have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises", "comprising", and should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method of producing a packaging substrate comprising:
    providing a first precursor having a first backbone and a first ethynyl group;
    providing a second precursor having a second backbone and a second ethynyl group;
    providing a crosslinker having at least a first and a second reactive group capable of forming a carbon-carbon bond;
    applying the first precursor, the second precursor, the crosslinker and a solvent onto a surface to form an electrically insulating layer;
    reacting the first ethynyl group with the first reactive group in a first carbon-carbon bond forming reaction and reacting the second ethynyl group with the second reactive group in a second carbon-carbon bond forming reaction, thereby crosslinking the first backbone with the second backbone to form the packaging substrate; and
    removing the solvent.
2. The method of claim 1 wherein at least one of the first and second backbones comprises an aryl group.
3. The method of claim 2 wherein the aryl group is conjugated with the first or second ethynyl group.
4. The method of claim 3 wherein the aryl group comprises an arylethynyl.
5. The method of claim 4 wherein the arylethynyl is a phenylethynyl.
6. The method of claim 1 wherein the backbone comprises an indane.
7. The method of claim 6 wherein the indane is 1,1,3-trimethyl-3-phenylindane.
8. The method of claim 1 wherein the backbone comprises an oligomer.
9. The method of claim 8 wherein the oligomer comprises an oligo-(1,1,3-trimethylindane).
10. The method of claim 1 wherein at least one of the first and the second backbones further comprises an adhesion enhancer.
11. The method of claim 10 wherein the adhesion enhancer comprises a silane or siloxane group.
12. The method of claim 11 wherein the silane or siloxane group is selected from the group consisting of a vinyltriethoxy silane, a vinyltrimethoxy silane, a vinylmethyldimethoxy silane, a γ-methacryloxypropyltrimethoxy silane, a vinyltriacetoxy silane, a vinyl terminated siloxane, and a polysiloxane.
13. The method of claim 1 wherein the surface comprises organic fiber.
14. The method of claim 1 wherein the surface comprises a glass fiber.
15. The method of claim 1 wherein the first and second carbon-carbon bond forming reaction is a Diels-Alder reaction, a 4+2 cycloaddition, or a 2+2 cycloaddition.
16. The method of claim 1 wherein the first and second carbon-carbon bond forming reaction is a free radical reaction.
17. The method of claim 1 wherein the first and second carbon-carbon bond forming reaction is an Ene-reaction, a Glaser coupling, or a Straus coupling.
18. The method of claim 1 wherein the first precursor is covalently bound via a bridging group to the second precursor.
19. The method of claim 18 wherein the bridging group is an ethylene, an acetylene, a divinyl benzene, or a diisopropenylbenzene.

20. The method of claim 18 wherein the first or second precursor comprises an indane.

21. The method of claim 18 wherein the backbone of the first or second backbone comprises a bromine.

22. The method of claim 18 wherein the first or second precursor comprises an adhesion enhancer.

23. The method of claim 1, further comprising:

providing a toughener; and wherein the step of applying further comprises applying the toughener together with the first and second precursor, and the crosslinker onto a surface to form an electrically insulating layer.

24. The method of claim 21 wherein the backbone comprises a phenylethynyl group.

25. The method of claim 2 wherein the backbone comprises an indane.

26. The method of claim 21 wherein the backbone comprises a bromine atom.

27. The method of claim 21 wherein the backbone comprises an adhesion enhancer.

28. The method according to any of claims 1, 16, or 25 wherein the crosslinker is selected from the group consisting of a bismaleimide/allylbisphenol, a benzocyclobutane, a bifunctional vinyl aromatic, a trifunctional vinyl aromatic, a multifunctional vinyl aromatic, and a strained cyclic aliphatic.

29. A flame retardant packaging substrate comprising:

a first backbone comprising a brominated indane;

a second backbone comprising a brominated indane;

a crosslinker covalently bound with a first bond to the first backbone and covalently bound with a second bond to the second backbone, wherein the first and the second bond are carbon-carbon bonds, respectively; and wherein the first and second bond are formed between a reactive group of the crosslinker capable of formation of a carbon-carbon group, and an ethynyl group of the first and second backbone, respectively; and a reinforcing dielectric material.

* * * * *